United States Patent
Tsukikawa

(10) Patent No.: US 6,867,994 B2
(45) Date of Patent: Mar. 15, 2005

(54) SEMICONDUCTOR MEMORY DEVICE WITH MEMORY CELLS ARRANGED IN HIGH DENSITY

(75) Inventor: Yasuhiko Tsukikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 102 days.

(21) Appl. No.: 10/464,480

(22) Filed: Jun. 19, 2003

(65) Prior Publication Data

US 2004/0156255 A1 Aug. 12, 2004

(30) Foreign Application Priority Data

Dec. 13, 2002 (JP) .......... 2002-362280

(51) Int. Cl.$^7$ .......... G11C 5/06; G11C 11/04; G11C 7/00; G11C 7/02
(52) U.S. Cl. .......... 365/72; 365/134; 365/203; 365/207; 365/214
(58) Field of Search .......... 365/72, 134, 203, 365/207, 214

(56) References Cited

U.S. PATENT DOCUMENTS

| | | | | |
|---|---|---|---|---|
| 5,084,746 A | * | 1/1992 | Arimoto et al. | 257/303 |
| 6,137,713 A | * | 10/2000 | Kuroda et al. | 365/149 |
| 6,316,306 B1 | * | 11/2001 | Park | 438/239 |
| 6,452,859 B1 | * | 9/2002 | Shimano et al. | 365/230.06 |
| 2002/0089870 A1 | * | 7/2002 | Honda | 365/145 |
| 2002/0192902 A1 | * | 12/2002 | Kimura et al. | 438/253 |
| 2004/0071022 A1 | * | 4/2004 | Wald et al. | 365/200 |
| 2004/0201054 A1 | * | 10/2004 | Siek | 257/296 |

FOREIGN PATENT DOCUMENTS

| | | |
|---|---|---|
| JP | 7-130172 | 5/1995 |
| JP | 8-293587 | 11/1996 |

OTHER PUBLICATIONS

Iizuka, Tetsuya "Design of CMOS VLSI" (Apr. 15, 1989) p. 90, (w/partial English translation).

* cited by examiner

Primary Examiner—David Nelms
Assistant Examiner—Ly Duy Pham
(74) Attorney, Agent, or Firm—McDermott Will & Emery LLP

(57) ABSTRACT

A field region forming a transistor is provided in a direction crossing a word line and a bit line. A bit line contact is provided corresponding to each bit line in a row direction. Storage node contacts are provided in alignment corresponding to respective columns in the row direction. The size of a basic cell region for forming a single memory cell can be set to 2·F·3·F. Here, F represents a minimum design size. Accordingly, memory cells in a twin cell mode DRAM storing one bit of data with two memory cells can be reduced in size.

10 Claims, 10 Drawing Sheets

F I G. 4
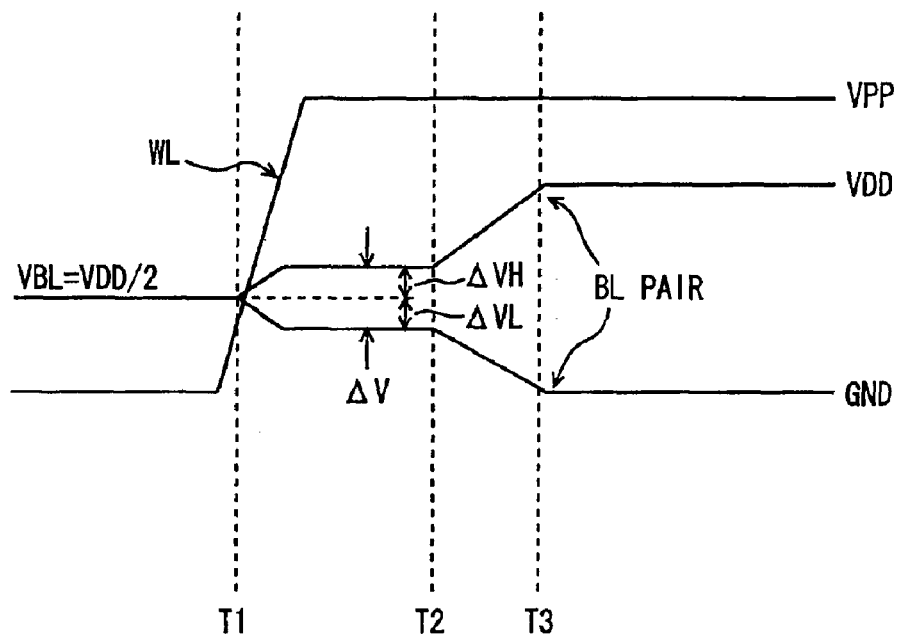

SEMICONDUCTOR MEMORY DEVICE WITH MEMORY CELLS ARRANGED IN HIGH DENSITY

BACKGROUND OF THE INVENTION

1. Field of the Invention

The present invention generally relates to a semiconductor memory device, and in particular, to a twin cell DRAM (Dynamic Random Access Memory) storing data of one bit with two memory cells. More specifically, the present invention relates to a layout of memory cells in a twin cell mode DRAM.

2. Description of the Background Art

In a DRAM, a memory cell is generally configured of one selection (access) transistor and one capacitor, and data is stored in the capacitor in the form of charges. An electrode node storing the data of the memory cell capacitor is referred to as a storage node. Charges corresponding to data are accumulated at the storage node. An electrode facing this storage node is referred to as a cell plate electrode and receives a voltage of a prescribed level.

In data reading, the charges accumulated in the capacitor is transferred to a bit line via the selection transistor of the memory cell. A voltage of the bit line is then amplified by a sense amplifier.

A folded bit line configuration is generally employed as a bit line arrangement in order to reduce an influence of a noise upon a sensing operation. In the folded bit line configuration, a pair of bit lines are provided in parallel on one side of the sense amplifier. The storage data of the memory cell is read on one bit line of the pair. The other bit line is maintained at the level of a prescribed reference voltage (precharge voltage). A voltage difference between the pair of bit lines is amplified by the sense amplifier.

The amount of voltage change ΔV caused in a bit line before the sensing operation upon selection of the memory cell is given by the following expression (1), where a bit line capacitance is Cb, a capacitance value of the memory cell capacitor is Cs, and a potential difference between a storage node voltage and the precharge voltage is Vca.

$$\Delta V = Vca \cdot Cs/(Cb+Cs) \qquad (1)$$

In general, as the precharge voltage, a voltage VDD/2 is provided, which is ½ times a power supply voltage VDD of the memory cell. An H level and an L level of the storage data of the memory cell are a voltage VDD and a ground voltage (GND), respectively. Accordingly, Vca=VDD/2. As a typical example, when Cs=25 fF, Cb=100 fF, VDD=2V, and a cell plate voltage is 1V, the amount of voltage change (a read voltage) ΔV of this bit line is expressed by the following expression:

$$\Delta V = (25/125) \cdot (2/2) = 0.2 \text{ V}.$$

In a general DRAM cell, two bit memory cells are formed in a unit active region. A bit line contact is shared between these two-bit memory cells. Adjacent unit active regions are electrically isolated by a field insulator film.

The bit line contact is provided for electrically connecting the memory cell active region to a corresponding bit line. In the folded bit line configuration, bit line contacts are generally provided for every other column (every other bit line). This is because the memory cell data must be read on only one of the pair of bit lines upon selection of one word line. Accordingly, there is created regularly a bit line contact-free region in a column direction.

A prior art document 1 (Japanese Patent Laying-Open No. 8-293587) discloses a layout for reducing a region free of bit line contact to arrange memory cells in higher density. In the prior art document 1, a memory cell active region is provided such that it crosses a bit line and a word line. In addition, a contact (a storage node contact) between a storage node of a memory cell capacitor and the active region is provided for a region corresponding to the region free of bit line contact. Through the provision of the storage node contact making use of the region free of bit line contact, a memory array area is utilized efficiently.

As a memory cell is shrunk, an area occupied by a memory cell capacitor is correspondingly reduced. Thus, capacitance value Cs of the memory cell capacitor decreases, and accordingly, the previously described read voltage ΔV is also reduced. As a result, a sensing operation cannot accurately be performed. In particular, when memory cells are highly integrated, the voltage level of memory power supply voltage VDD is reduced in order to ensure the reliability of a gate insulating film. Thus, read voltage ΔV lowers, and a sensing margin is decreased. As a result, it becomes difficult to perform an accurate sensing operation.

In the prior art document 1 described above, memory cells are arranged in the folded bit line configuration, and the memory cells could be arranged in high density. However, as a layout area occupied by the memory cell is reduced in accordance with an increased integration, bit line read voltage ΔV correspondingly decreases.

A prior art document 2 (Japanese Patent Laying-Open No. 7-130172) discloses a DRAM storing one bit of data with two memory cells for prevention of a decrease in operational margin, such as a decrease in read voltage, upon reduction in layout area occupied by a memory cell.

In the prior art document 2, a memory cell layout is similar to a general DRAM cell layout in which data of one bit is stored in one memory cell (one bit/one cell; a single mode). In addition, two word lines are concurrently selected to read memory cell data on each bit line of a pair of bit lines. Through the storage of complementary data in two memory cells, a voltage difference between the bit lines can be twice that in the single mode of one bit/one cell. Accordingly, a stabilized sensing operation can be achieved.

In a DRAM cell, a capacitor is utilized as a data storage medium. Thus, storage data may be lost through a leakage current. In order to prevent such a data disappearance, in a conventional DRAM, a refresh operation is performed, in which memory cell data is internally read, rewritten, and the original data is restored.

As a memory cell becomes shrunk, a capacitance value of a memory cell capacitor correspondingly decreases. Accordingly, an interval between refresh operations is required to be shorter. The shorter refresh intervals reduce the system processing efficiency, because the DRAM is generally inaccessible during the refresh operation. In addition, power dissipation for the refresh operation is increased.

When a one bit/two cell (twin cell) mode is employed, in which data of one bit is stored with two memory cells as described in the prior art document 2, a refresh interval can be longer. An area occupied by unit cell storing one-bit data, however, is increased since two memory cells are employed for storing data of one bit. If two conventional DRAM cell layouts are simply utilized to implement a twin cell storing data of one bit, a layout area by the twin cell of the data storage unit doubles. In this case, the storage capacity is ½ times compared to the typical single mode configuration in which data of one bit is stored in one memory cell. Thus, a twin cell mode DRAM with a large storage capacity cannot easily be realized.

Therefore, in order to realize a twin cell mode DRAM of a large storage capacity, a reduction in area occupied by the twin cell is necessary. In the memory cell layout described in the prior art document 1, the active region is provided in a direction crossing a bit line and a word line. In the prior art document 1, however, the storage node contact is arranged corresponding to the region free of bit line contact. Thus, a bit line contact and the storage node contact are alternately provided in the row direction. As a result, a regularity of a layout pattern is impaired.

Furthermore, an efficient utilization of a region free of bit line contact is simply intended. Memory cells are provided on alternate columns in the row direction. Therefore, in order to arrange the memory cells in high density, a further improvement in layout needs to be made.

In addition, in the prior art document 1, a typical folded bit line configuration is assumed. Thus, when the memory cell layout described in the prior art document 1 is employed for a twin cell configuration, memory cell data is merely transferred to only one of the pair of bit lines upon selection of one word line. In order to implement a twin cell mode, two word lines must be selected concurrently to transfer memory cell data to both bit lines in the pair. As a result, a problem arises that more current is consumed upon selection of word lines.

SUMMARY OF THE INVENTION

An object of the present invention is to provide a semiconductor memory device allowing high-density arrangement of memory cells.

Another object of the present invention is to provide a semiconductor memory device in which twin cell can be formed in a small layout area.

A further object of the present invention is to provide a semiconductor memory device having a memory cell layout with which a twin cell mode can be implemented by selection of one word line.

A semiconductor memory device according to the present invention includes a plurality of memory cells arranged in rows and columns, a plurality of bit lines provided corresponding to the memory cell columns, and a plurality of word lines provided corresponding to the memory cell rows and in a direction crossing the bit lines. Each memory cell includes a transistor, a capacitor, an active region extending in a direction between a direction in which a corresponding word line extends and a direction in which a corresponding bit line extends so as to cross the corresponding word and bit lines, and defining a transistor formation region, and a storage node electrically connected to the active region and serving as one electrode of the capacitor. A bit line contact electrically connecting the active region of each memory cell and a corresponding bit line is aligned in a row direction and provided for each bit line. Two word lines are provided between bit line contacts adjacent in a column direction. Each bit line contact is shared by two memory cells adjacent in the column direction.

By arranging the memory cell active region such that it crosses the word and bit lines at an angle different from the right angle, the memory cell active region can correspond to a hypotenuse region of a right triangle. Therefore, in comparison with the arrangement in which the active region crosses the word line at the right angle, the lengths of the memory cell active region in the vertical and horizontal directions can be reduced. As a result, a unit area of the memory cell can be decreased, and the layout area size of twin cells can be reduced.

In the row direction, the bit line contact is provided for each bit line. Upon selection of one word line, storage data of memory cells are transferred to all bit lines. Therefore, through the storage of complementary data in memory cells connected to a pair of bit lines, a twin cell mode can be implemented by selection of one word line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram representing a variation in bit line voltage and word line voltage upon sensing operation in the semiconductor memory device shown in FIG. 3.

DESCRIPTION OF THE PREFERRED EMBODIMENTS

First Embodiment

Figure 1:
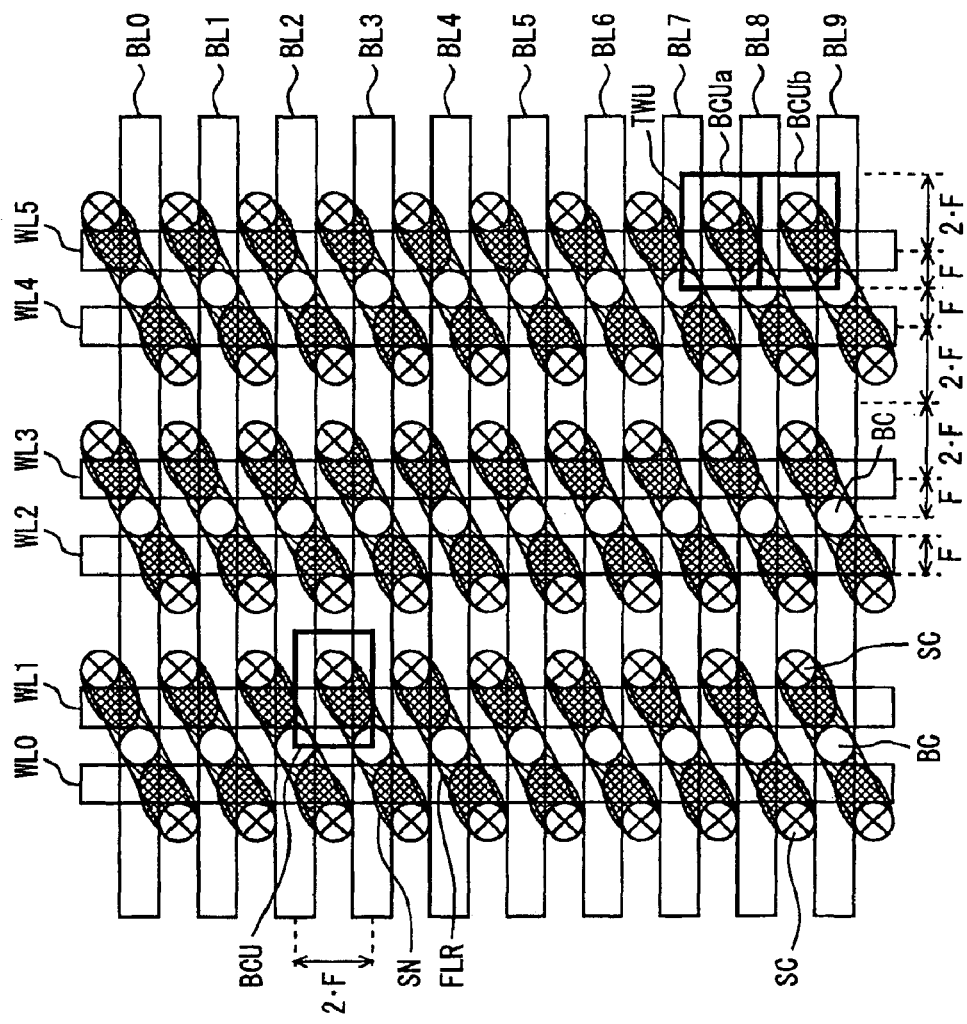
FIG. 1 schematically shows a memory array layout in accordance with a first embodiment of the present invention.

FIG. 1 schematically shows a layout of a memory cell array portion in a semiconductor memory device in accordance with a first embodiment of the present invention. In FIG. 1, word lines WL0 to WL5 are arranged extending in a row direction, while bit lines BL0 to BL9 are arranged extending in a column direction. These word lines WL0 to WL5 and bit lines BL0 to BL9 are arranged crossing with each other in FIG. 1. Each of word lines WL0 to WL5 is made of, for example, a polysilicon interconnection line, while each of bit lines BL0 to BL9 is made of, for instance, a first metal interconnection line at an upper layer.

In a direction crossing word lines WL0 to WL5 and bit lines BL0 to BL9, an active region (a field region) FLR is provided. Two DRAM cells are formed in a single field region FLR.

A bit line contact BC is formed in a crossing portion of field region FLR and bit line BL (generically indicating BL0 to BL9).

In field region FLR, storage node contacts SCs are provided at ends opposing to bit line contact BC with respect to word lines WLs (generically indicating WL0 to WL5).

A storage node SN is electrically connected to field region FLR via storage node contact SC provided at each of opposite ends of field region FLR. Storage node SN accumulates charges corresponding to information stored in a capacitor in a DRAM cell. In each field region FLR, storage node SN is formed above the field region between storage node contact SC and bit line contact BC.

Although not explicitly shown in FIG. 1, facing the storage node SN, a cell plate is provided at an upper layer as a common electrode of the memory cells. A constant cell plate voltage VCP is applied to this cell plate. Storage node SN and the cell plate may be formed on a layer over or under bit line BL. They are referred to as a COB (capacitor over bit line) structure and as a CUB (capacitor under bit line) structure, respectively.

In the arrangement shown in FIG. 1, bit line contacts BCs are aligned and provided corresponding to respective bit lines in the row direction. Storage node contacts SCs are also aligned and provided corresponding to the respective columns in the row direction.

There are two kinds of pitches between word lines WLs. First, a pitch between word lines WLs (e.g. WL0 and WL1) sandwiching bit line contact BC is 2·F. Here, F is a minimum design size. In FIG. 1, the width of a word line, a width of and a pitch of a bit line are each set to F. Second, a pitch between word lines (e.g. WL1 and WL2) sandwiching storage node contact SC is 4·F. Word lines WLs are arranged at a pitch of 2·F and at a pitch of 4·F alternatively.

A pitch between bit lines BLs is 2·F. Bit line contacts BCs are arranged at a pitch of 6·F in the column direction.

A basic cell region BCU forming a DRAM cell is defined by a rectangular region including one bit line contact BC and one storage node contact SC. Basic cell region BCU has a length of 2·F in the row direction and a length of 3·F in the column direction. Accordingly, an area of basic cell region BCU is 6·F^2, where a symbol ^ represents a power.

Bit lines BL0 to BL9 are arranged in pairs. Upon selection of one word line WL, storage data of memory cells is read on each bit line of the pair of bit lines. Twin cells TWU are configured of basic cell regions BCUa and BCUb. Complementary data are stored in memory cells formed in these basic cell regions BCUa and BCUb. For example, when word line WL5 is selected in FIG. 1, storage data of the memory cells formed in basic cell regions BCUa and BCUb are read on bit lines BL8 and BL9. A sense amplifier provided for the pair of bit lines senses and amplifies the complementary data on the pair of bit lines. Accordingly, the area occupied by twin cell TWU is given by 2·6·F^2.

Figure 2:
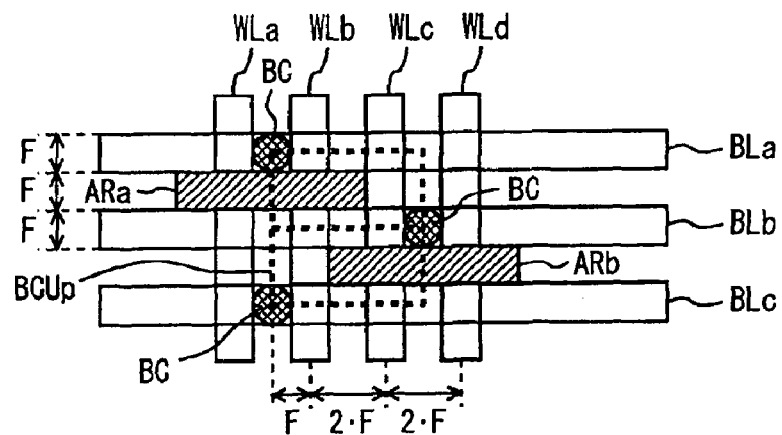
FIG. 2 schematically shows a layout of an array portion of conventional DRAM cells.

For the purpose of comparison, FIG. 2 schematically shows a layout of a conventional DRAM cell. FIG. 2 representatively illustrates word lines WLa to WLd and bit lines BLa to BLc. A DRAM cell is formed in each of T-shaped active regions (field regions) ARa and ARb. Each of active regions ARa and ARb has a region extending in a column direction to form a transistor and a region protruding in a row direction to make a bit line contact. These active regions ARa and ARb are staggered two rows with respect to each other in the column direction. T-shaped active regions are arranged in alignment such that bit line contacts BCs are provided for alternate bit lines in the row direction. A unit configuration formed of active regions ARa and ARb in FIG. 2 is arranged repeatedly in the row and column directions.

Two-bit memory cells are formed in each of active regions ARa and ARb. Each of active regions ARa and ARb is electrically connected to a corresponding bit line via bit line contact BC. In FIG. 2, active region ARa is connected, via bit line contact BC, to bit line BLa, while active region ARb is electrically connected, via bit line contact BC, to bit line BLb.

The line width of word line WL (WLa to WLd) is F, and the space between word lines WLs is also F. Accordingly, a pitch between word lines WLs is 2·F. This relation also holds for bit line BL (BLa to BLc). A pitch between bit lines is 2·F. Bit line contacts BCs are arranged at a pitch of 4·F in the row direction. Although not explicitly shown in FIG. 2, in the column direction, bit line contacts BCs are provided for every fifth word line. Thus, bit line contacts BCs are provided at a pitch of 8·F.

A basic cell region BCUp is configured of one bit line contact BC and a storage node contact not illustrated in FIG. 2. Therefore, basic cell region BCUp of this DRAM cell has a length of 4·F in the column direction and of 2·F in the row direction, and has the size of 8·F^2. Since twin cell is formed of two basic cell regions BCUps, the size of twin cells is 16·F^2. In the memory cell arrangement in FIG. 2, bit line contacts BCs are arranged at a pitch of 4·F in the row direction and are provided for alternate bit lines. Thus, in order to read data of the DRAM cell on a pair of bit lines (e.g. BLa and BLb), two word lines (e.g. WLb and WLc) need be concurrently driven to a selected state.

As shown in FIGS. 1 and 2, in basic cell region BCU in accordance with the present embodiment, only one word line WL is arranged crossing basic cell region BCU in the row direction. On the other hand, in basic cell region BCUp of the conventional DRAM cell shown in FIG. 2, two word lines (e.g. WLb and WLc) are provided for the basic cell region. Accordingly, an area occupied by basic cell region BCU in accordance with the present embodiment can be sufficiently smaller than that occupied by the conventional DRAM cell.

Furthermore, according to the DRAM cell layout shown in FIG. 2, memory cells are provided for alternate columns in the row direction. On the other hand, in the first embodiment, a memory cell is provided on each column in the row direction. Thus, DRAM cells can be arranged in higher density.

Figure 3:
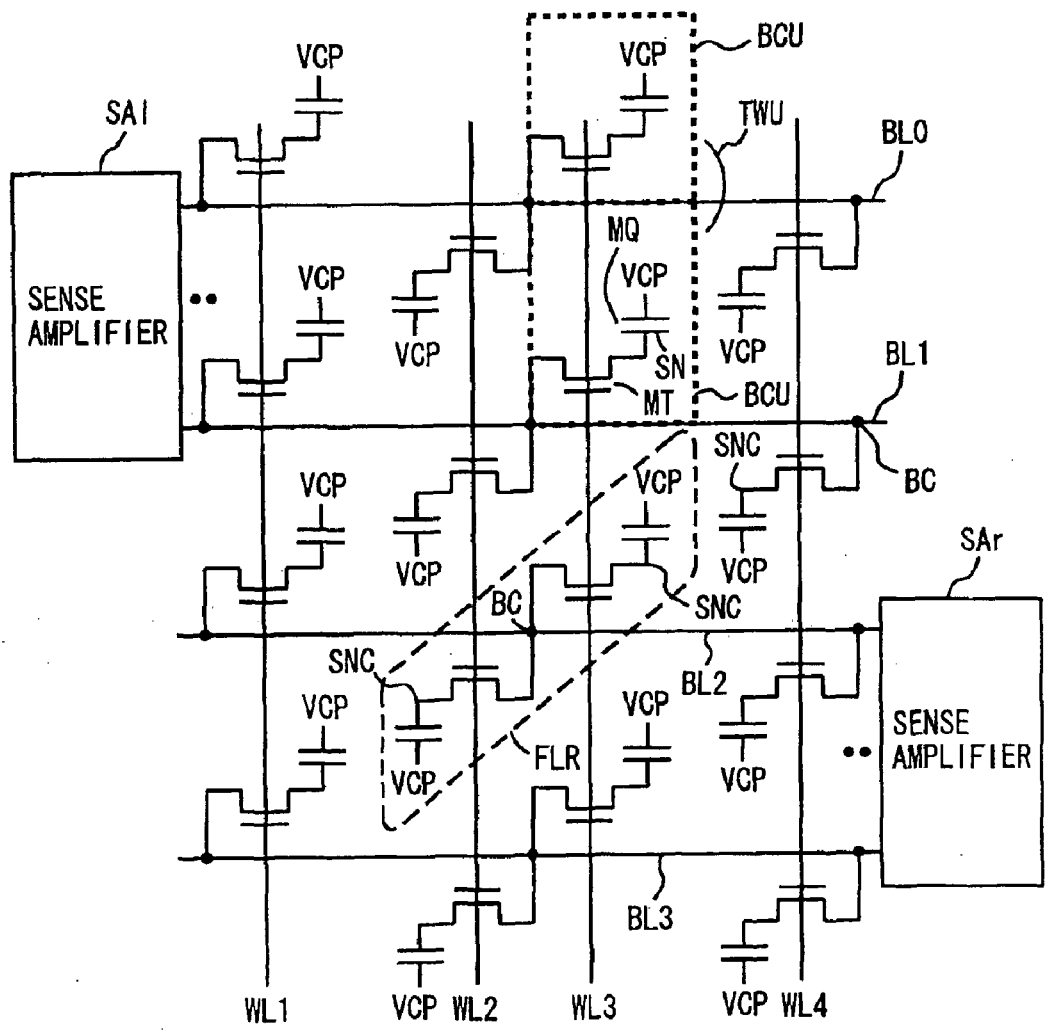
FIG. 3 shows an electrically equivalent circuit of an array portion in a semiconductor memory device in accordance with the first embodiment of the present invention.

FIG. 3 shows an electrical equivalent circuit corresponding to the memory cell layout shown in FIG. 1. In FIG. 3, word lines WL1 to WL4 and bit lines BL0 to BL3 are illustrated. In basic cell region BCU, there are formed a memory capacitor MQ storing information in the form of charges in storage node SN, and an access transistor MT selectively rendered conductive in response to a signal of the corresponding word line WL (WL1 to WL4) and electrically connecting storage node SN of memory cell capacitor MQ to the corresponding bit line BL (BL0 to BL3) when made conductive. This access transistor MT is formed of an N channel MOS transistor (an insulated gate field effect transistor) in the configuration shown in FIG. 3. Cell plate voltage VCP at a prescribed voltage level is applied to a cell plate of memory cell capacitor MQ.

Therefore, a one transistor/one capacitor type DRAM cell is formed in basic cell region BCU. The gates of access transistors in basic cell regions BCUs aligned in the row direction are in common coupled to the same word line. Field region (active region) FLR includes two-bit DRAM cells. In field region FLR, bit line contact BC and storage node contacts SNCs arranged symmetrically with respect to this bit line contact BC are formed. Specifically, in field region FLR, two memory cells arranged in the same column and in adjacent rows are provided. Twin cell TWU storing one bit of data is provided by memory cells formed in two basic cell regions BCUs aligned in the row direction.

Bit lines BL0 and BL1 are arranged in a pair and coupled to a sense amplifier SAl. Bit lines BL2 and BL3 are arranged in a pair and coupled to a sense amplifier SAr. In an arrangement of the sense amplifiers shown in FIG. 3, sense amplifiers SAl and SAr are alternately provided on opposite sides of the pairs of bit lines. In the configuration shown in FIG. 3, when word line WL2 is selected, storage data of memory cells is respectively read on bit lines BL0 to BL3. Sense amplifiers SAl and SAr are generally configured of cross-coupled sense amplifiers, and differentially amplify potentials of the corresponding pairs of bit lines. By writing complementary data to storage nodes SNs of the memory cells in basic cell regions BCUs included in twin cell TWU, a read voltage supplied to the sense amplifier can be large. In the following, a sensing operation will briefly be described with reference to FIG. 4.

In a standby state, bit line BL (BL0 to BL3) is precharged at a level of an intermediate voltage VDD/2.

At time T1, word line WL (e.g. WL2) is driven to a selected state (a high voltage VPP level). As the voltage of word line WL increases, access transistor MT in the selected row is rendered conductive. Responsively, the charges corresponding to the storage data of the memory cell are transferred to the corresponding bit line. Data is read on each of bit lines in the pair. In the twin cell, one memory cell stores data at an H level, while the other memory cell stores data at an L level. Thus, the voltage on one bit line in a pair increases from the intermediate voltage level, whereas the voltage on the other bit line in the pair decreases from intermediate voltage VDD/2. A voltage difference ΔV between the pair of bit lines BLs is given by a sum of the amount of voltage change ΔVH on the bit line in reading data of the H level and the amount of voltage change ΔVL on the bit line in reading data of the L level.

When the bit line precharge voltage VBL is intermediate voltage VDD/2 and cell plate voltage VCP is also intermediate voltage VDD/2, amounts of voltage change on the bit lines, ΔVH and ΔVL, are equal to each other. Thus, the voltage difference ΔV between the bit lines is doubled, as compared to the case in which data is read on only one bit line in a normal single cell mode. When cell plate voltage VCP and bit line precharge voltage VBL are equal to, in particular, intermediate voltages VDD/2, the voltage difference ΔV between the bit lines is given by the following equation.

$$\Delta V = Cs/(Cs+Cb) \times VDD$$

Thus, even when sense amplifiers SAl and SAr are activated at time T2, the voltage difference between the bit lines at time T2 is sufficiently large. Therefore, an accurate sensing operation can be ensured to drive, at time T3, these bit lines to a power supply voltage VDD level and a ground voltage GND level.

When a sensing operation is performed with a read voltage of a single cell mode, the sense starting time T2 can be advanced, to shorted the access time.

Complementary data always appear on bit lines in a pair to cause a voltage difference between the bit lines. Thus, even if a refresh interval is made longer, the sensing operation can be performed accurately (the refresh interval will be described later). Through the employment of twin cells, the refresh interval can be made longer, and the number of times of refresh operation can be reduced to reduce the current consumption. Furthermore, the system processing efficiency can be improved.

As described above, in accordance with the first embodiment of the present invention, the active region (the field region) forming the DRAM cell are formed crossing the bit line and the word line, and the bit line contact is provided for each column. Therefore, a memory cell arrangement can be achieved with the so-called closest packing structure of an open bit line configuration to arrange the memory cells in higher density. Furthermore, only a single selected word line allows reading of memory cell data on the bit lines in each pair, to reduce the number of selected word lines to reduce the current consumption.

The folded bit line configuration is employed. Therefore, even if noises are generated in a pair of bit lines, common phase noises are applied to a sense amplifier, to be cancelled out for achieving an accurate sensing operation.

When the conventional DRAM cell layout is utilized to form a twin cell DRAM, an area occupied by the twin cell unit is 16·F^2. On the other hand, according to the first embodiment, an area occupied by the twin cell unit is 12·F^2. Therefore, when 64 M-bit DRAM is to be formed by twin cell mode DRAM, a chip area can be reduced to 12/16=3/4 times, to reduce the cost of the memory device.

Second Embodiment

Figure 5:
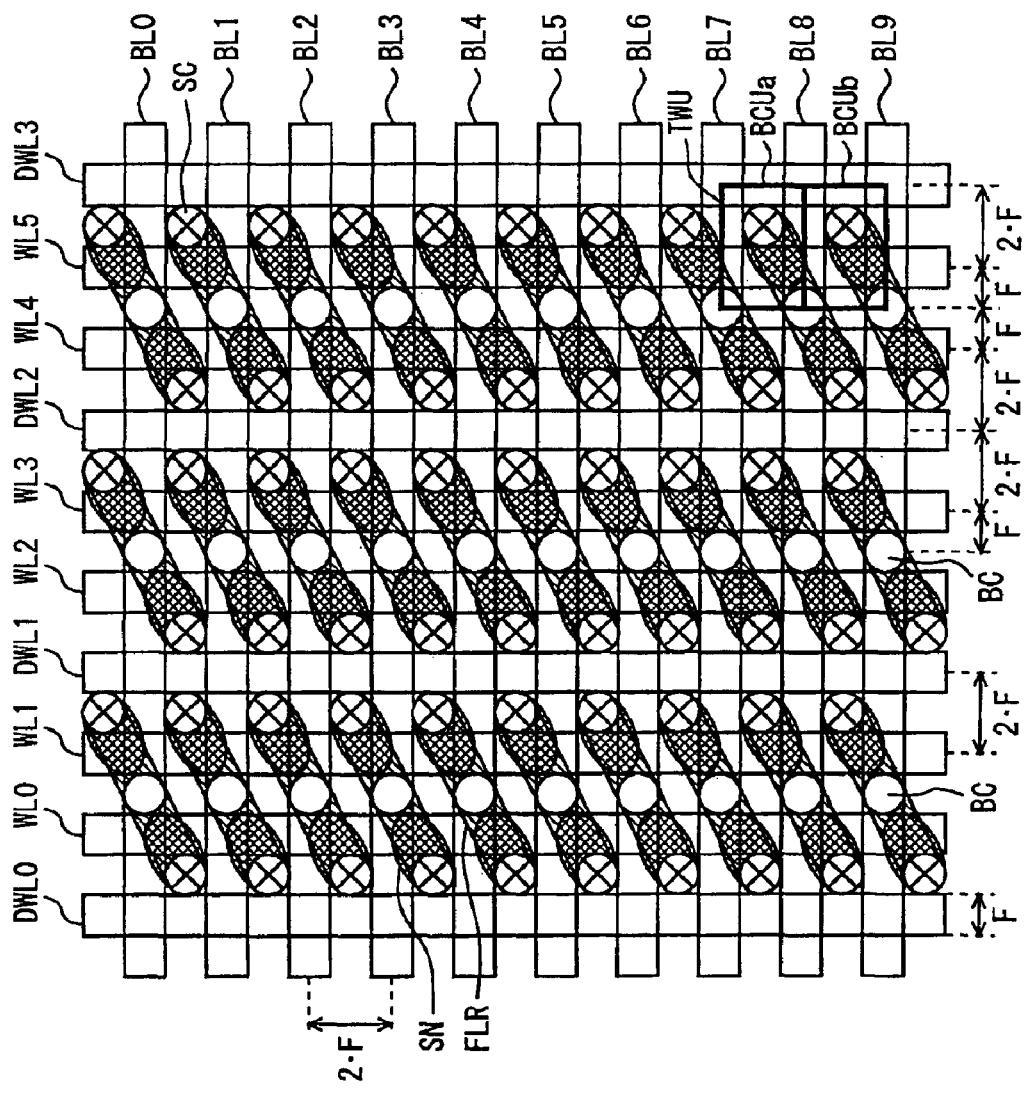
FIG. 5 schematically shows a layout of a memory array in a semiconductor memory device in accordance with a second embodiment of the present invention.

FIG. 5 schematically shows a layout of a memory array in a semiconductor memory device in accordance with a second embodiment of the present invention. The layout shown in FIG. 5 is different from the layout in FIG. 1 in the following point. Specifically, a dummy word line DWL (DWL0 to DWL3) is provided in a region between storage node contacts SCs formed in field regions adjacent in a column direction. In other words, dummy word line DWL is provided between word lines WLs arranged at a pitch of 4·F. The other portions of the layout shown in FIG. 5 are similar to those of the layout in FIG. 1. Thus, the same reference numerals are assigned to corresponding portions, and a detailed description thereof will not be repeated.

Dummy word line DWL is formed at the same interconnection line layer as word line WL, and is fabricated through the same manufacturing process as word line WL. Therefore, an additional process and mask are not required for the provision of dummy word line DWL.

A pitch between word line WL (WL0 to WL5) and dummy word line DWL (DWL0 to DWL3) is 2·F. Thus, a pitch between word lines including word line WL and dummy word line DWL is 2·F, and word lines and dummy word lines can be arranged regularly. The common pattern can be repeated, and it becomes possible to prevent an influence such as an irregular reflection of an exposure light at a step portion due to a deviation in pattern regularity, and a precise patterning can be achieved. This enables a precise patterning of a storage node or the like even in a microfabrication.

Figure 6:
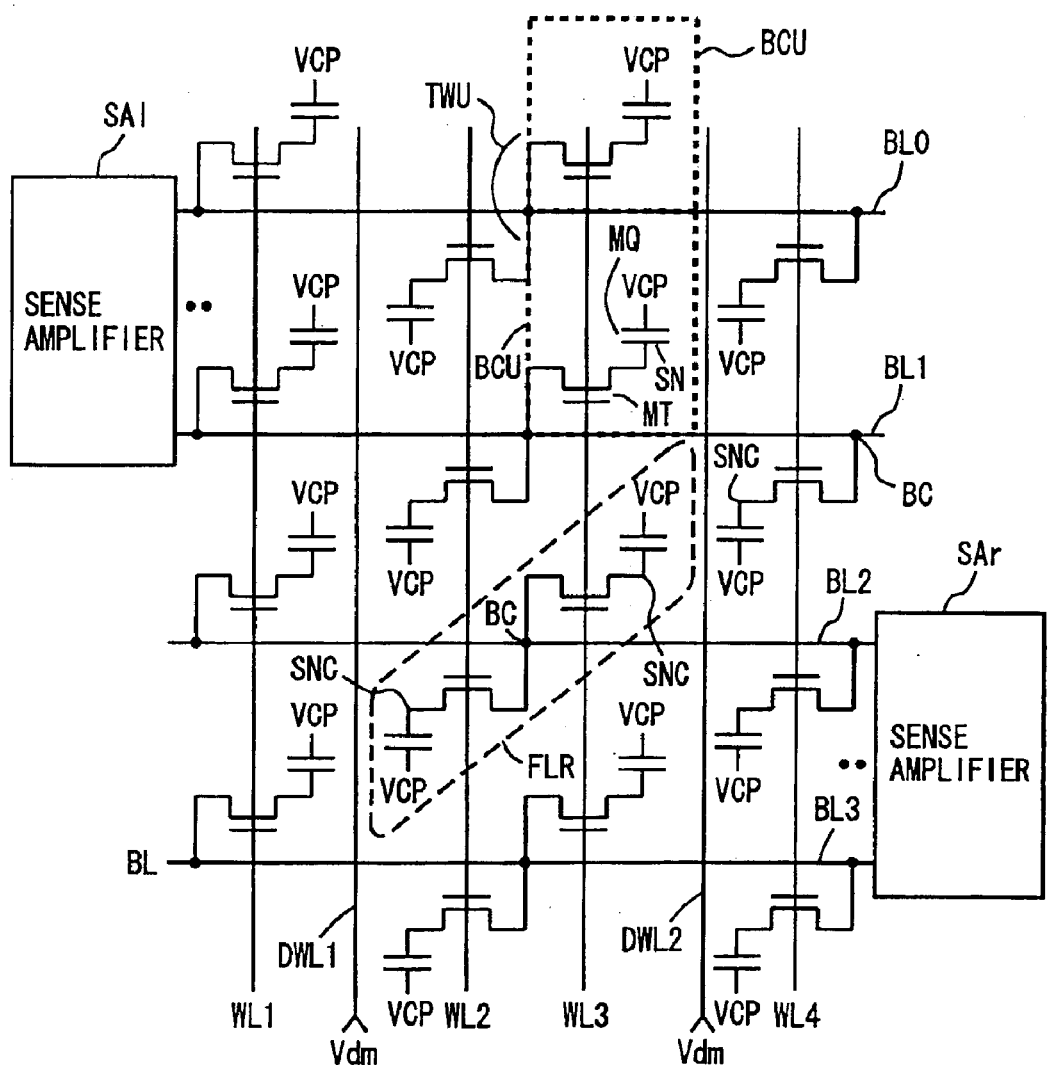
FIG. 6 shows an electrically equivalent circuit of the layout of the memory cell array shown in FIG. 5.

FIG. 6 shows an electrically equivalent circuit of the layout in FIG. 5. In a configuration shown in FIG. 6, dummy word line DWL1 is provided between word lines WL1 and WL2, and dummy word line DWL2 is provided between word lines WL3 and WL4. Dummy word lines DWL1 and DWL2 are formed at the same interconnection line layer as word lines WL1 to WL4. No memory cell is coupled to dummy word lines DWL1 and DWL2. A voltage Vdm is applied to dummy word lines DWL1 and DWL2. As described in detail later, under the dummy word line, a thick insulator film is formed for isolating the storage nodes. Voltage Vdm is a ground voltage or a negative voltage, and attracts positive charges to a region below the thick isolating insulator film formed under the dummy word line for isolating field regions (active regions) FLRs adjacent in the column direction.

The other configurations in FIG. 6 are similar to those shown in FIG. 3. Thus, the same reference numerals are assigned to corresponding portions, and a detailed description thereof will not be repeated.

Figure 7:
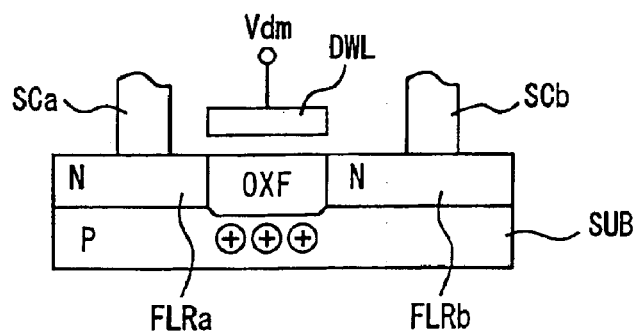
FIG. 7 schematically shows a cross-sectional structure of a dummy word line region in the layout shown in FIG. 5.

FIG. 7 schematically shows a cross-sectional structure of the substrate region of the dummy word line portion. As shown in FIG. 7, field regions FLRa and FLRb are formed being spaced at the surface of a P type substrate region SUB. Field regions (active regions) FLRa and FLRb are N type impurity regions. Storage node contacts SCa and SCb are formed for field regions FLRa and FLRb, respectively. Thick isolating insulator film OXF is formed between field regions FLRa and FLRb. A surface of isolating insulator film OXF is planarized, for example, through CMP (chemical mechanical polishing), to reduce the underlying step upon formation of the dummy word line, for forming the normal word line and the dummy word line in the same manufacturing steps.

Dummy word line DWL is provided on thick isolating insulator film OXF between field regions FLRa and FLRb. The prescribed voltage Vdm is normally applied to this dummy word line DWL. Accordingly, positive charges are attracted to a region below thick isolating insulator film OXF between field regions FLRa and FLRb to form a potential barrier against electrons present in field regions FLRa and FLRb. Accordingly, storage node contacts SCa and SCb are reliably isolated from each other, to enhance the isolation between the storage nodes. Consequently, a memory cell formed in each of field regions FLRa and FLRb can store data stably.

As described above, according to the second embodiment of the present invention, the dummy word line is arranged at the same interconnection line layer as the word line in a region between storage nodes adjacent in the column direction. The word line pitches can be equivalently made equal for all the word lines, and a precise micro-fabrication of a word line and others can be achieved.

In addition, through application of the prescribed voltage to the dummy word line, a potential barrier for isolating the storage nodes can be formed under the region below this dummy word line, and the storage nodes can be reliably isolated.

Third Embodiment

Figure 8:
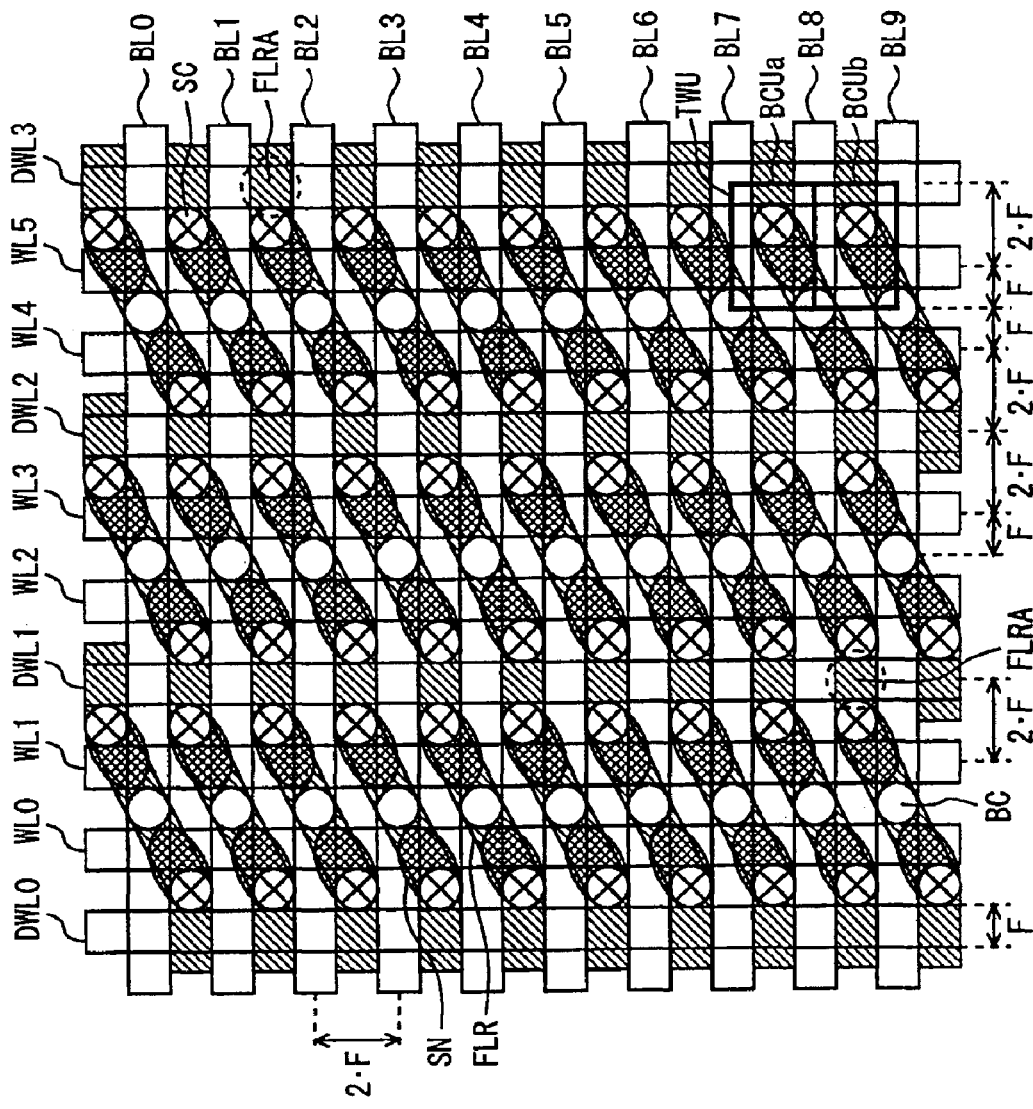
FIG. 8 schematically shows a layout of an array portion in a semiconductor memory device in accordance with a third embodiment of the present invention.

FIG. 8 schematically shows a layout of a memory array portion in a semiconductor memory device in accordance with a third embodiment of the present invention. In the layout shown in FIG. 8, a field region FLRA is formed in a region below each of dummy word lines DWL0 to DWL3, and field regions FLRs are formed continuously. Thus, field regions FLRs of memory cells in adjacent rows and adjacent columns are formed continuously, and field regions FLRs are formed extending along one direction. Field region FLRA formed in a region below dummy word line DWL (DWL0 to DWL3) extends linearly in the column direction, and physically connect the field regions provided for opposite storage nodes with respect to the dummy word line.

A ground voltage or a negative voltage Vdm is applied to each of dummy word lines DWL0 to DWL3.

The other configurations in the layout shown in FIG. 8 are similar to those in the layout shown in FIG. 5. Thus, the same reference numerals are assigned to corresponding portions, and a detailed description thereof will not be repeated.

Figure 9:
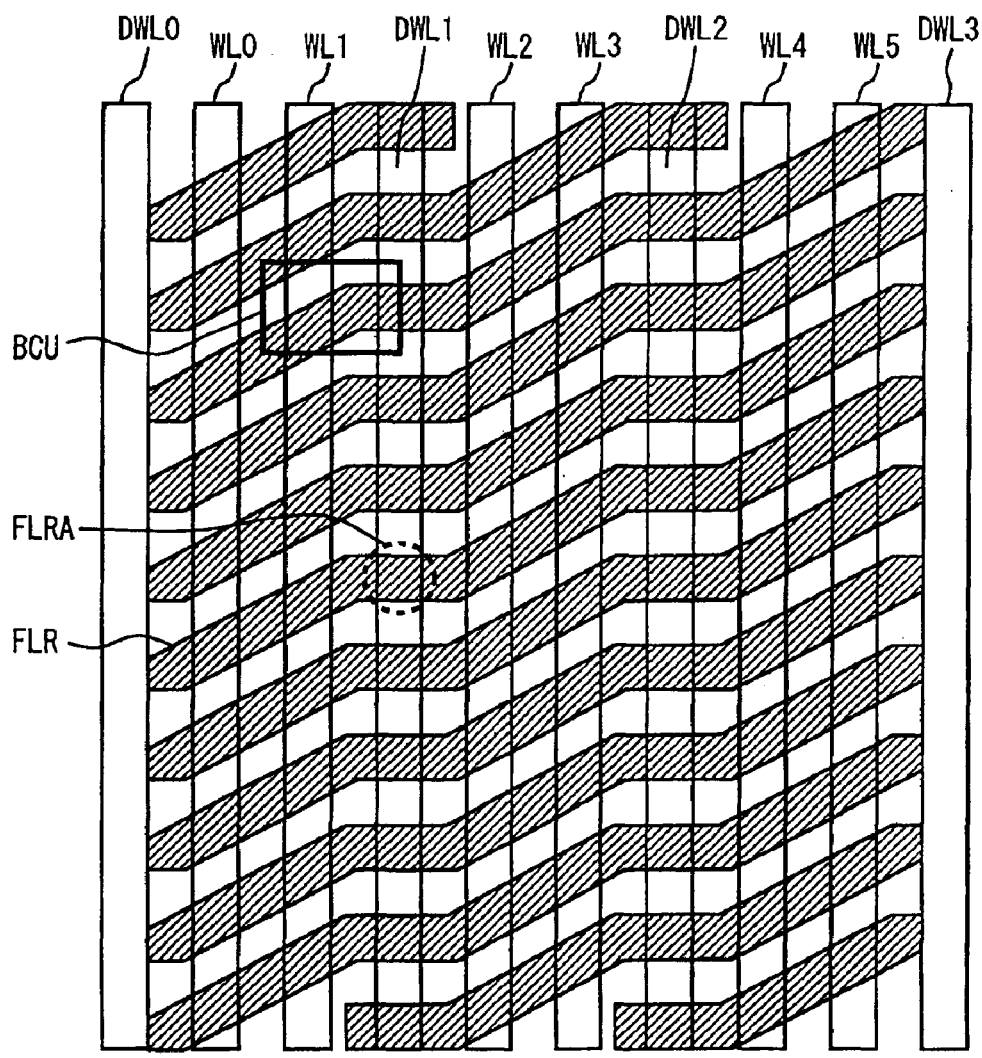
FIG. 9 shows a layout of a field region in the layout shown in FIG. 8.

FIG. 9 schematically shows a layout of field region FLR, word lines WL0 to WL5, and dummy word lines DWL0 to DWL3 illustrated in FIG. 8. As shown in FIG. 9, field regions FLRs are formed continuously by field region FLRA formed in a region below a dummy word line. Therefore, field region FLR need not be divided for each two bit memory cells, or each twin cell, and a simplified layout of the field region can be achieved. In addition, an area occupied by the field region can be reduced. A precise micro-fabrication of a basic cell region BCU can be achieved.

Figure 10:
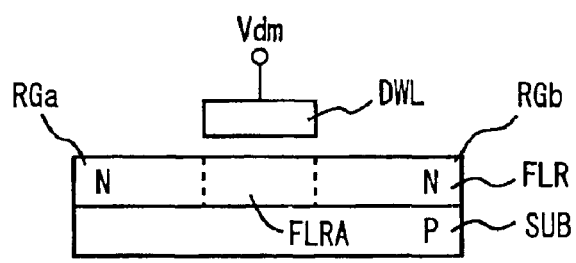
FIG. 10 schematically shows a cross-sectional structure of a dashed-line portion in FIG. 9.

FIG. 10 schematically shows a cross-sectional structure of field region FLRA portion formed below a dummy word line. As shown in FIG. 10, field regions FLRs are formed continuously by region FLRA formed in a region below dummy word line DWL. Voltage Vdm at a prescribed voltage level, such as the ground voltage or the negative voltage, is applied to dummy word line DWL. An electron inversion layer is not formed in region FLRA below the dummy word line in accordance with voltage Vdm, and a transistor formed by regions RGa, RGb, and FLRA in field region FLR is kept off to isolate regions RGa and RGb.

Even if continuous field region FLR is formed at the surface of a substrate region SUB by N type impurity region, dummy word line DWL assures a reliable electrical isolation between the storage nodes.

As described above, according to the third embodiment of the present invention, a field region is formed in a region below a dummy word line as well so that field regions are continuously formed in a stripe shape. Accordingly, the thick isolating insulator film for isolating field regions between adjacent storage nodes is not required, and the field region can be readily patterned. Furthermore, since the insulator film for isolating the field regions is not required, and a layout area of basic cell region BCU is reduced, and a miniaturized memory cell can be provided.

In addition, through application of a prescribed voltage to the dummy word line, the transistor in the field region can be made off, to achieve a reliable isolation between storage nodes of memory cells as well as a reliable data storage.

Fourth Embodiment

Figure 11:
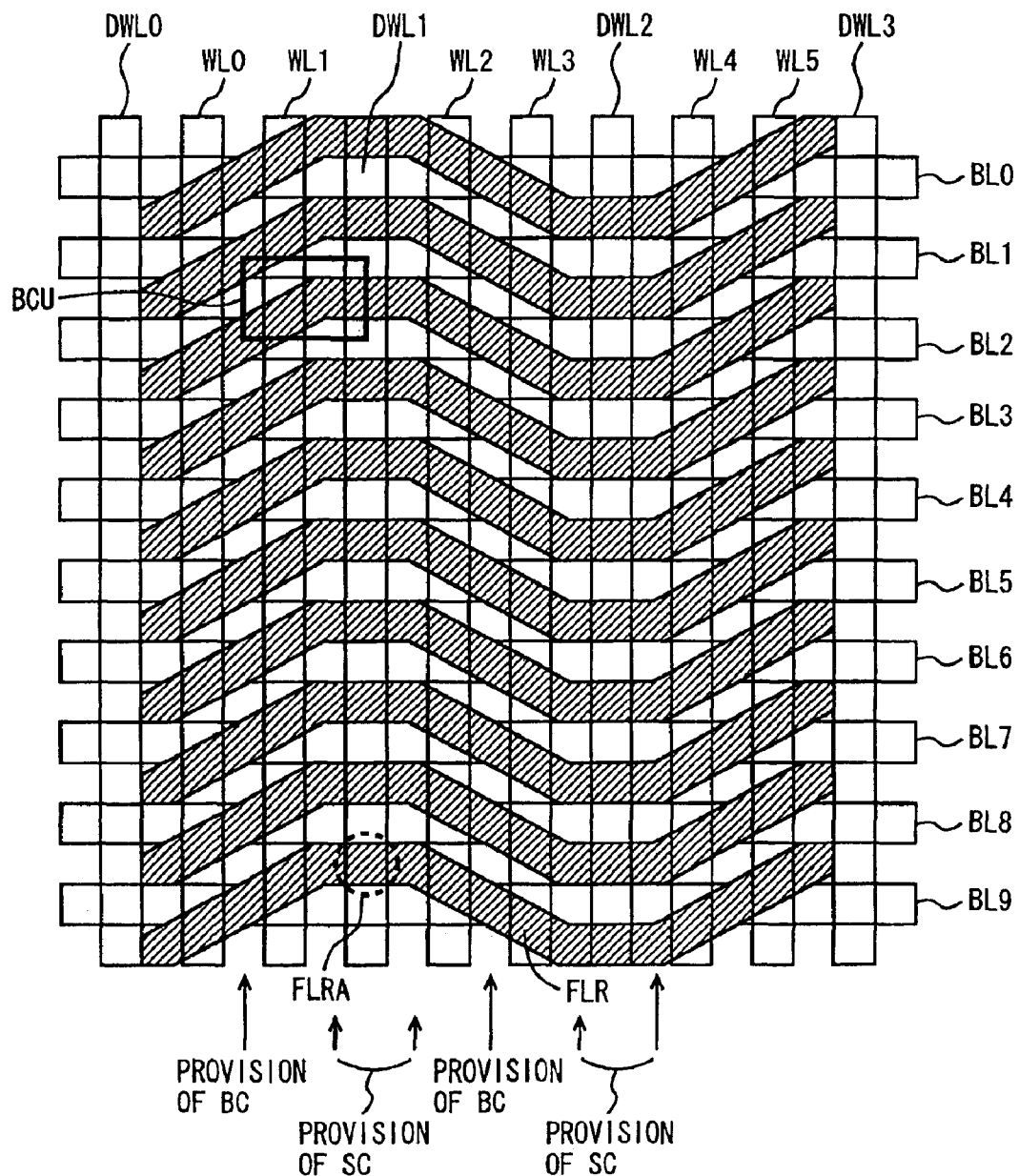
FIG. 11 schematically shows a layout in a modification of a fourth embodiment of the present invention.

FIG. 11 schematically shows a memory array layout in accordance with a fourth embodiment of the present invention. In FIG. 11 as well, word lines WL0 to WL5, dummy word lines DWL0 to DWL3, and bit lines BL0 to BL9 are representatively illustrated. In the layout shown in FIG. 11, a gradient direction of a field region FLR alternates between an upward direction and a downward direction in a column direction such that field regions FLRs are arranged symmetrically with respect to dummy word line DWL. A field region (an active region) FLRA is also formed in a region below dummy word line DWL, and field regions FLR is formed in each column continuously. Accordingly, field region FLRA formed in a region below a dummy word line enables a formation of the continuous field region for memory cells in the same column.

In a region between adjacent word lines, a bit line contact BC is arranged corresponding to each bit line. In a region between dummy word line DWL (generically indicating dummy word lines) and word line WL (generically indicating word lines), a storage node contact SC is arranged corresponding to each column. Accordingly, storage node contacts SCs are arranged facing to each other with respect to dummy word line DWL (DWL0 to DWL3).

In the layout shown in FIG. 11, an area occupied by a basic cell region BCU is $6 \cdot F^2$. The layout in FIG. 11 is the same as the layout in the third embodiment except for the following point. Specifically, the stripe shape of field region FLR in FIG. 11 is formed in a continuous zigzag pattern in the column direction, whereas the stripe shape in the third embodiment extends monotonously in one direction upward as it extends rightward.

In the layout shown in FIG. 11 as well, field regions FLRs are formed continuously by field regions FLRAs formed in regions below dummy word lines DWL0 to DWL3, and a thick isolating insulator film or the like for isolating field regions is not required.

As in the third embodiment, a voltage Vdm is applied to each of dummy word lines DWL0 to DWL3. Field region FLRA functions as a field isolating region. Accordingly, a field insulator film is not required, and a continuous field regions FLRs can be provided to facilitate the patterning of a field region as in the third embodiment.

Figure 12:
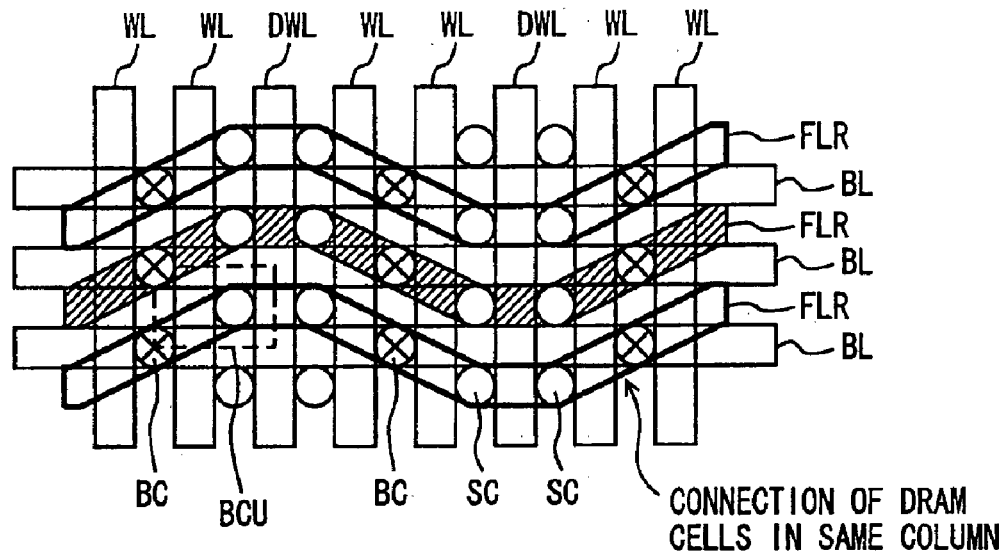
FIG. 12 shows an arrangement of contacts in the layout shown in FIG. 11.

FIG. 12 schematically shows an arrangement of the field region, the bit line contact, and the storage node contact in accordance with the forth embodiment of the present invention. As shown in FIG. 12, storage node contacts SCs are arranged facing to each other with respect to dummy word line DWL, and storage node contacts SCs are arranged in alignment in the row direction. Bit line contacts BCs are also arranged in alignment in the row direction and provided corresponding to bit lines BLs. Bit line contacts BCs are arranged at a pitch of $6 \cdot F$ in the column direction. Memory cells formed in one field region FLR are all connected to the same bit line BL via a corresponding bit line contact BC. A pitch between bit lines BLs is $2 \cdot F$ and that a pitch between word lines including a dummy word line is also $2 \cdot F$.

Basic cell region BCU has a size of $6 \cdot F^2$. Thus, the difference between the layouts in the third and fourth embodiments is the form of the stripe shape of field region FLR, and field region FLR can accurately be patterned as in the third embodiment. In addition, an effect similar to that in the third embodiment can be provided.

Fifth Embodiment

Figure 13:
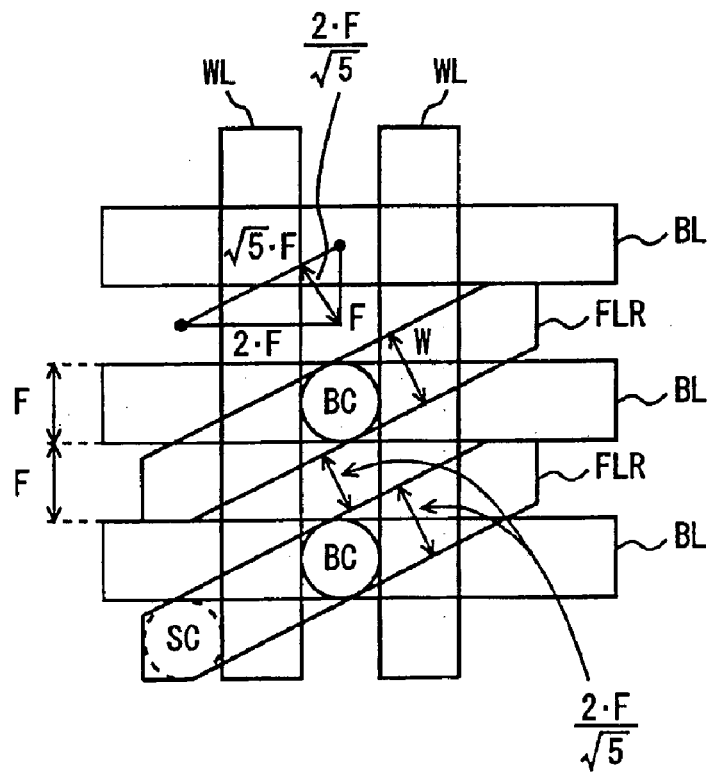
FIG. 13 shows an arrangement of a field region of a memory cell in accordance with the present invention.

FIG. 13 schematically shows an arrangement of a field region FLR for forming a DRAM cell. In FIG. 13, two word lines WLs and three bit lines BLs are representatively illustrated. Field region FLR is electrically connected to bit line BL via a bit line contact BC, and is electrically connected to a storage node (not shown) via a storage node contact SC. The width and a pitch of bit line BL are each F. A width and a pitch of word line WL are each F as well. Therefore, a distance between central points of bit line contact BC and storage node contact SC is sqrt $5 \cdot F$. Here, the symbol "sqrt" represents a square root. The lengths projected in the horizontal and vertical directions of the distance between bit line contact BC and storage node contact SC are F and $2 \cdot F$, respectively. Thus, the width and the pitch of field region FLR are both given by $2 \cdot F/\text{sqrt } 5 = 0.89 \cdot F$.

As shown in FIG. 2, the width of the field region of the conventional DRAM cell is equal to bit line pitch F, and a pitch between fields is also equal to the bit line width F. In comparison with the pattern of the field region of the conventional DRAM cell, the field region pattern in the first to fourth embodiments provides a reduced pitch.

In the field of semiconductor physics, Dennard et al. proposed a scaling rule in 1974. This scaling rule is described, for example, in "Design of CMOS VLSI", published by Baifukan, 1989, page 90 et seq. According to the scaling rule described in this prior art document, when the channel width (the width of a field region) W of an MOS transistor is scaled down with a scaling ratio of 1/K, a voltage V should be scaled down by a rate of 1/K.

According to the scaling rule, the field width of F in the above-described typical DRAM cell is scaled down to $0.89 \cdot F$ in the first to fourth embodiments, and it is preferable to scale down the voltage V to $0.89 \cdot V$. Thus, the basic cell having the size of $6 \cdot F^2$ in the first to fourth embodiments can be operated with a voltage lower than the voltage for the conventional basic cell having the size of $8 \cdot F^2$.

In a single cell mode DRAM, bit line precharge voltage VBL is generally at the level of intermediate voltage VDD/2. A memory power supply voltage VDD is at the level of a voltage two times as high as bit line precharge voltage VBL.

In contrast, in a twin cell mode DRAM, the voltage level of bit line precharge voltage VBL is not limited to this intermediate voltage VDD/2.

As shown in FIG. 4, the voltage level of intermediate voltage VDD/2 is generally utilized for bit line precharge voltage VBL in the single cell mode DRAM. The bit line precharge voltage VBL, however, can be set at power supply voltage VDD in the twin cell mode DRAM.

Figure 14:
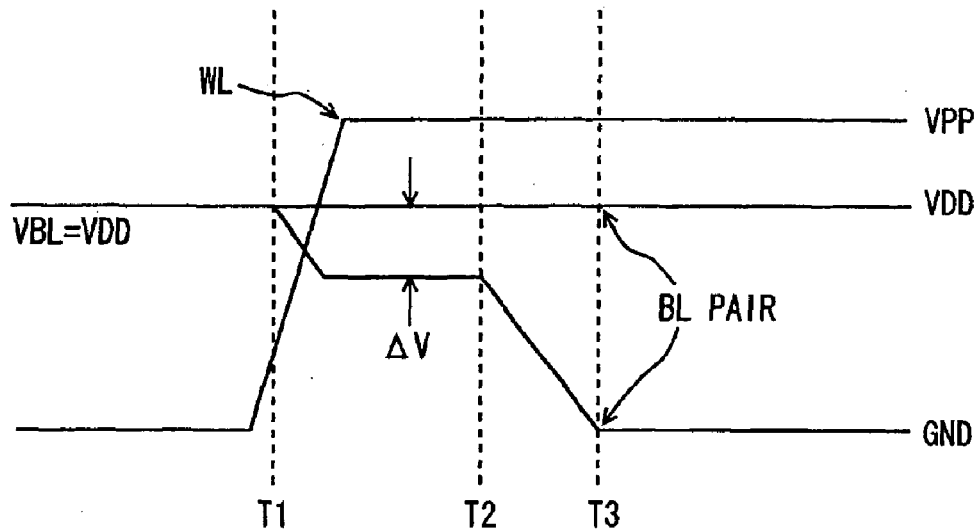
FIG. 14 shows a bit line voltage waveform upon sensing operation in a VDD bit line precharge scheme.

It is now assumed, as shown in FIG. 14, that at time T1, a voltage level of a selected word line WL is set at a high voltage VPP, and storage data of a memory cell is read on a corresponding bit line. In the twin cell mode, data at the H level and data at the L level are read on bit lines in a pair. When bit line precharge voltage VBL is power supply voltage VDD, voltage difference ΔV between bit lines in the pair is expressed by the following equation, regardless of the level of a cell plate voltage.

$$\Delta V = Cs \cdot VDD/(Cb+Cs)$$

At time T2, a sensing operation is performed, and the bit line receiving the L level data is driven down to the level of ground voltage GND. Therefore, in the twin cell mode DRAM, even when the voltage level of bit line precharge voltage VBL is at the level of array power supply voltage VDD, other than the level of intermediate voltage VDD/2 as described in FIG. 4, an accurate sensing operation can be performed to read the memory cell data. Cell plate voltage (VCP) may be array power supply voltage VDD, or may be intermediate voltage VDD/2.

As described above, a sensing operation is started at time T2. In the sensing operation, in accordance with the extent by which the bit line potential is higher than the ground voltage, the bit line onto which the data at the L level is read is determined and discharged. In this sensing operation, an N sense amplifier configured of a cross-coupled N channel MOS transistor discharges the bit line at L level to the ground voltage level. The bit line onto which the data at the H level is read maintains the power supply voltage level of the precharge voltage level. In the sensing operation of the voltage level of the bit lines, the N sense amplifier senses the voltage level of this bit line with reference to the precharge voltage. The bit line voltage is determined through selective driving by a memory cell in accordance with storage data. Therefore, when viewed from the memory cell, bit line precharge voltage VBL can be regarded an operating voltage of the memory cell, that is, a voltage driven by an access transistor.

The idea that the bit line precharge voltage is regarded as the operating voltage of the memory cell is also applicable to the case in which a bit line is precharged to half a power supply voltage. This is because the bit line voltage is driven by the memory cell similarly in accordance with the storage data.

Therefore, according to the scaling rule, by making bit line precharge voltage VBL lower than the bit line precharge voltage of the conventional single cell DRAM, the memory cell can be operated optimally.

In an SDRAM (a clock synchronous DRAM) operating in synchronization with a clock signal, a memory cell is configured of one DRAM cell. In such SDRAM, a power supply voltage EXTVcc applied by an external terminal is a 3.3 V standard.

In a DRAM, when an external power supply voltage extVcc is intactly utilized as power supply voltage VDD of a memory cell, if the external power supply voltage extVcc varies between its upper-limit voltage and its lower-limit voltage, the amount of charges accumulated in a capacitor of the DRAM cell, VDD·Cs/2 (Cb+Cs), changes. In this case, voltage difference ΔV appearing on bit lines also changes, to deteriorate the margin for a stable operation of the sense amplifier and the data retention characteristics. Accordingly, in some DRAMs, external power supply voltage extVcc is down-converted by a power supply voltage down-converter internally provided, and the down-converted voltage is utilized as power supply voltage (sense power supply voltage) VDD for the memory cell.

In the above-described SDRAM, when external power supply voltage extVcc is to be down-converted, a voltage lower than the lower-limit voltage, in the range between 1.5 V and 3.3 V, is generally utilized as power supply voltage VDD for the memory cell. A voltage ½ times as high as memory cell power supply voltage VDD, that is, a voltage in the range between 0.75 V and 1.65 V, is utilized as bit line precharge voltage VBL.

In the first to fourth embodiments, it is most optimal to drive an access transistor of a memory cell by bit line precharge voltage VBL lower than the conventionally used voltage. The scaling-down rate of the operating voltage is 0.89, based on the scaling-down rate of the field region. Accordingly, in the fifth embodiment, a voltage ranging between 0.75·0.89 V and 1.65·0.89 V, that is, a voltage between 0.65 V and 1.5 V is suitably utilized as bit line precharge voltage VBL.

Figure 15:
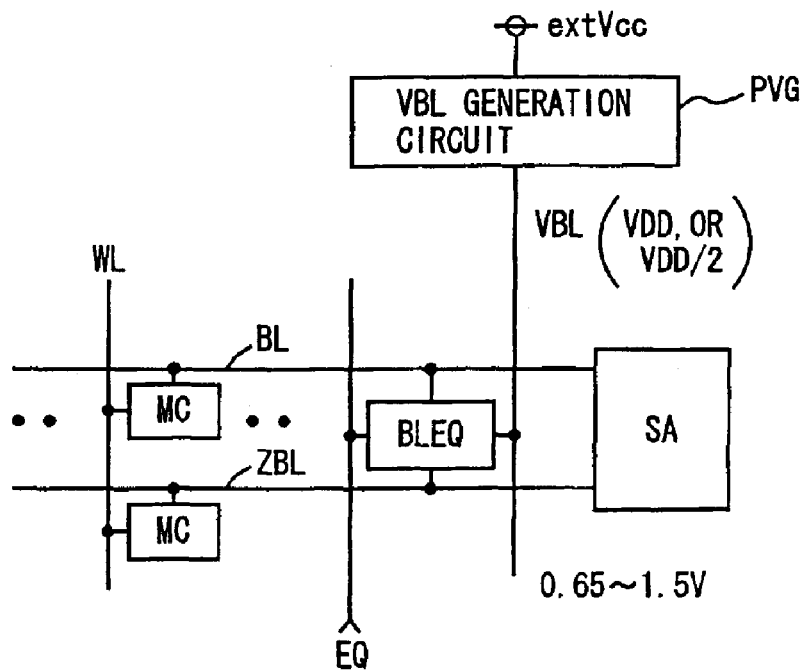
FIG. 15 schematically shows a configuration of a portion related to a bit line precharge voltage.

FIG. 15 schematically shows a configuration of a portion related to this bit line precharge voltage. In FIG. 15, memory cells MCs are provided corresponding to crossings of bit lines BL and ZBL and word line WL. Memory cells MCs are DRAM cells and each have one transistor/one capacitor type cell structure. A bit line precharge/equalize circuit BLEQ for transmitting bit line precharge voltage VBL to bit lines BL and ZBL in accordance with an equalize instruction signal EQ and a sense amplifier SA for differentially amplifying and latching the voltages of bit lines BL and ZBL are provided for bit lines BL and ZBL.

Bit line precharge/equalize circuit BLEQ is generally configured of transfer gates, and transmits bit line precharge voltage VBL to bit lines BL and ZBL and equalizes them.

Bit line precharge voltage VBL is produced from external power supply voltage extVcc by a VBL generation circuit PVG. When bit line precharge voltage VBL is memory power supply voltage VDD, VBL generation circuit PVG is configured of a down-converter for down-converting external power supply voltage extVcc to produce memory cell power supply voltage VDD. When bit line precharge voltage VBL is VDD/2, VBL generation circuit PVG is configured of an internal down-converter for down-converting external power supply voltage extVcc to produce memory cell power supply voltage VDD and a reference voltage generation circuit for dividing memory cell power supply voltage VDD output from the internal down-converter to produce the voltage of VDD/2.

According to the above discussion, bit line precharge voltage VBL lies in the range between 0.65 V and 1.5 V. Therefore, power supply voltage VDD for the memory cell, that is, a level of the voltage VDD driven by sense amplifier SA differs depending on a bit line precharge scheme. In a VDD/2 precharge scheme, memory power supply voltage VDD is 2·VBL, and is a voltage in the range between 1.3 V and 3.0 V. In a VDD precharge scheme, VBL=VDD. Memory power supply voltage VDD lies in the range between 0.65 V and 1.5 V.

As described above, according to the fifth embodiment of the present invention, the bit line precharge voltage is set to fall within a range from 0.65 V to 1.5 V in accordance with a scale-down rate of the access transistor of the memory cell. The bit line precharge voltage can be set at an optimum value in accordance with the scaling rule of a memory cell transistor. Accordingly, a stable operation of the memory cell transistor can be achieved. In addition, charges can be transferred between a bit line and a storage node with the same operational characteristics as that of the conventional DRAM cell.

In addition, the bit line precharge voltage can be decreased, and a current consumption required for a bit line precharge can be reduced. Since the memory power supply voltage is set at a low voltage, a bit line amplitude can be smaller, to reduce the current consumption required for bit line charging and discharging. Furthermore, a sensing operation can be completed at a faster timing, to set the bit line voltage at a definite state.

When the power supply voltage of the memory cell is set at a low level, the amount of charges accumulated in the memory cell capacitor decreases. Because of the twin cell mode operation, however, a sufficient voltage difference between bit lines can be assured. In addition, a reduction in field width decreases a junction capacitance of an access transistor, to reduce the bit line capacitance correspondingly. As a result, a decrease in read voltage on the bit line can be suppressed to achieve the sensing operation with the sufficient sensing margin assured.

In the first to fifth embodiments described above, memory cells are equivalently arranged in the folded bit line configuration, and the sense amplifier provided at one side of the bit line pair senses and amplifies the complementary data.

In the memory cell arrangement according to the first to fourth embodiments, a memory cell is provided corresponding to a crossing of each word line and each bit line, and the arrangement of the memory cells can be regarded as the open bit line configuration. Thus, it is also possible to employ an open bit line configuration in which bit lines provided on opposite sides of a sense amplifier are utilized as a pair of bit lines, and the sensing operation is performed. In this case as well, through storage of complementary data in memory cells provided on both sides of the sense amplifier, a twin cell mode operation of the DRAM can be implemented.

As described above, according to the present invention, a field region of a memory cell is arranged crossing a bit line and a word line, a bit line contact is provided corresponding to a crossing of each bit line and each field region, and a storage node contact is also provided corresponding to a crossing of each bit line and each word line. Accordingly, an area occupied by a memory cell can be reduced to implement a twin cell with a reduced occupation area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory cells, arranged in rows and columns, each including a transistor and a capacitor;
    a plurality of bit lines provided corresponding to respective memory cell columns; and
    a plurality of word lines provided corresponding to respective memory cell rows and crossing said plurality of bit lines, each memory cell including an active region arranged extending in a direction between a direction of extension of a corresponding word line and a direction of extension of a bit line and arranged crossing the word line and the bit line and a storage node electrically connected to said active region and serving as one electrode of said capacitor, said active region defining a transistor formation region of said each memory cell, and
    a bit line contact for electrically connecting the active region of each of the memory cells and a corresponding bit line being provided in alignment for each bit line in a row direction, two word lines being provided between bit line contacts adjacent in a column direction, and each bit line contact being shared by two memory cells adjacent in the column direction.

2. The semiconductor memory device according to claim 1, wherein
    said plurality of bit lines are provided in pairs, and each bit line in a pair is supplied with charges of the storage node of a corresponding memory cell upon selection of one word line, and
    said semiconductor memory device further comprises a plurality of sense amplifiers provided corresponding to the pairs of bit lines and sensing and amplifying data on a corresponding pair of bit lines when activated.

3. The semiconductor memory device according to claim 1, further comprising:
    a plurality of dummy word lines each provided, in a region between the storage nodes formed corresponding to the memory cells on adjacent rows and adjacent columns, in parallel with the word lines, and transmitting a voltage at a prescribed level.

4. The semiconductor memory device according to claim 3, wherein
    a space between the word line and the dummy word line and a space between the word lines are substantially equal to each other.

5. The semiconductor memory device according to claim 3, wherein
    the active regions are formed extending continuously in a region below the dummy word lines.

6. The semiconductor memory device according to claim 3, wherein
    the active regions are formed continuously extending substantially along one direction such that the active regions of the memory cells on adjacent columns on adjacent rows are continuously extend.

7. The semiconductor memory device according to claim 3, wherein
    the active regions are continuously formed being arranged symmetrical with respect to the dummy word lines.

8. The semiconductor memory device according to claim 3, wherein
    the active region of memory cells provided in a common column is continuously formed.

9. The semiconductor memory device according to claim 1, further comprising:
    a precharge circuit for precharging the bit lines to a prescribed voltage level when activated, said prescribed voltage being set at a level of a voltage 0.89 times as high as a precharge voltage set when a voltage of storage data of said memory cell at an H level is in a range between 1.5 V and 3.3 V.

10. The semiconductor memory device according to claim 9, wherein
    the voltage of the storage data of the memory cell at the H level is at most 1.5 V, and said prescribed voltage has a voltage level in a range between 0.65 V and 1.5 V.

* * * * *